United States Patent [19]

Hastings et al.

[11] Patent Number: 4,857,841
[45] Date of Patent: Aug. 15, 1989

[54] PROXIMITY DETECTOR EMPLOYING MAGNETO RESISTIVE SENSOR IN THE CENTRAL MAGNETIC FIELD NULL OF A TOROIDAL MAGNET

[75] Inventors: Jerome K. Hastings, Sussex; Bruce C. Beihoff, Glendale; Mark A. Juds, New Berlin, all of Wis.

[73] Assignee: Eaton Corporation, Cleveland, Ohio

[21] Appl. No.: 139,350

[22] Filed: Dec. 29, 1987

[51] Int. Cl.⁴ .......................... G01B 7/30; G01P 3/48; H03K 17/95; H01F 7/02

[52] U.S. Cl. ..................................... 324/208; 307/309; 307/362; 324/174; 324/228; 324/235; 324/252; 335/302

[58] Field of Search ............... 324/207, 208, 228, 235, 324/251, 252, 174; 338/32 R, 32 H; 328/140; 307/309, 362; 335/296, 297, 302, 304, 306, 205; 73/DIG. 3, 361, 363; 361/179, 180; 246/247, 249; 340/551, 686

[56] References Cited

U.S. PATENT DOCUMENTS

| | | | |
|---|---|---|---|
| 2,342,561 | 2/1944 | Trevaskis | 324/228 X |
| 2,698,917 | 1/1955 | Van Urk et al. | 335/302 |
| 2,719,267 | 9/1955 | Kunz et al. | 335/302 X |
| 3,141,214 | 7/1964 | Bey | 335/302 X |
| 3,205,323 | 9/1965 | Deshautreaux | 324/228 X |
| 3,359,495 | 12/1967 | McMaster et al. | 324/235 |
| 3,864,671 | 2/1975 | Myer | 365/2 |
| 3,961,316 | 6/1976 | Myer | 365/43 X |
| 4,518,919 | 5/1985 | Ishida | 324/235 X |
| 4,524,932 | 6/1985 | Bodziak | 324/235 X |
| 4,691,185 | 9/1987 | Loubier et al. | 338/32 H |
| 4,717,876 | 1/1988 | Masi et al. | 335/306 X |
| 4,719,419 | 1/1988 | Dawley | 335/302 X |

FOREIGN PATENT DOCUMENTS 0045953  4/1977  Japan ................................. 324/228

Primary Examiner—Gerard R. Strecker
Attorney, Agent, or Firm—Krass & Young

[57] ABSTRACT

The present invention is a proximity sensor employing a magneto resistive structure. This proximity sensor includes a toroidal magnet having a central aperture, an inner circumference and an outer circumference. This toroidal magnet has a first magnetic pole at the inner circumference and a second magnetic pole at the outer circumference thereby creating a magnetic field null at a center portion of the central aperture. A magneto resistive structure is disposed at the magnetic field null in the central aperture of the toroidal magnetic. This magneto resistive structure has a resistance dependent upon magnetic flux. The proximity of a magnetically permeable target to the toroidal magnet shifts the position of the magnetic null, thereby causing a large change in the magnetic flux through the magneto resistive structure. An electrical detection circuit detects changes in this resistance for indication of the proximity of the magnetically permeable target.

14 Claims, 4 Drawing Sheets

PROXIMITY DETECTOR EMPLOYING MAGNETO RESISTIVE SENSOR IN THE CENTRAL MAGNETIC FIELD NULL OF A TOROIDAL MAGNET

TECHNICAL FIELD OF THE INVENTION

The technical field of the present invention is that of proximity sensors and more particularly magnetic proximity sensors.

BACKGROUND OF THE INVENTION

The present invention is in the field of proximity detectors. Proximity detectors have a wide range of uses and in particular can be used in shaft rotation detectors. This use is enabled by placing a proximity target on the shaft that is detected by a proximity detector located near the rotary path of the target. Passage of the target by the proximity detector is detected thereby detecting the rotation of the shaft. It is also possible to provide a plurality of such targets, permitting the detection of partial rotation of the shaft.

SUMMARY OF THE INVENTION

The present invention is a magnetic proximity detector which employs a magneto resistive structure. Such a magneto resistive structure exhibits a differing electrical resistance in the presence of differing magnetic fields. This differing electrical resistance can be detected thus detecting the magnetic field in the vicinity of the magneto resistive structure.

In accordance with the present invention the magneto resistive structure is disposed in the center of a toroidal magnet. This toroidal magnet has a first magnetic pole at its inner circumference and the opposite magnetic pole at its outer circumference. This arrangement creates a null magnetic field at the center of the hole of the toroid. The magneto resistive structure is placed at this null in the magnetic field.

This structure enables high sensitivity to any distortions in the magnetic field near the magneto resistive structure. Such distortions can be caused by the proximity of an object constructed of a magnetically permeable material. The presence of such a magnetically permeable material causes the lines of the magnetic field to shift, and in particular, cause a shift of the null point of the toroidal magnet. Even a small shift in this null location can cause a large change in the magnetic flux through the magneto resistive structure. This shift in the magnetic field can be detected via detection of the resistance of the magneto resistive structure.

In accordance with the present invention the magneto resistive structure is constructed as a Wheatstone bridge. This enables greater sensitivity to any changes in the resistance caused by changing magnetic fields. In accordance with the present invention a constant current source is employed to drive opposite arms of the Wheatstone bridge of the magneto resistive structure. The voltage difference appearing across the other pair of arms is measured. This provides a measure of the differential resistance within the Wheatstone bridge.

BRIEF DESCRIPTION OF THE DRAWINGS

These and other aspects and features of the present invention will become clear from the following description, in which.

DETAILED DESCRIPTION OF THE PREFERRED EMBODIMENTS

Figure 1:
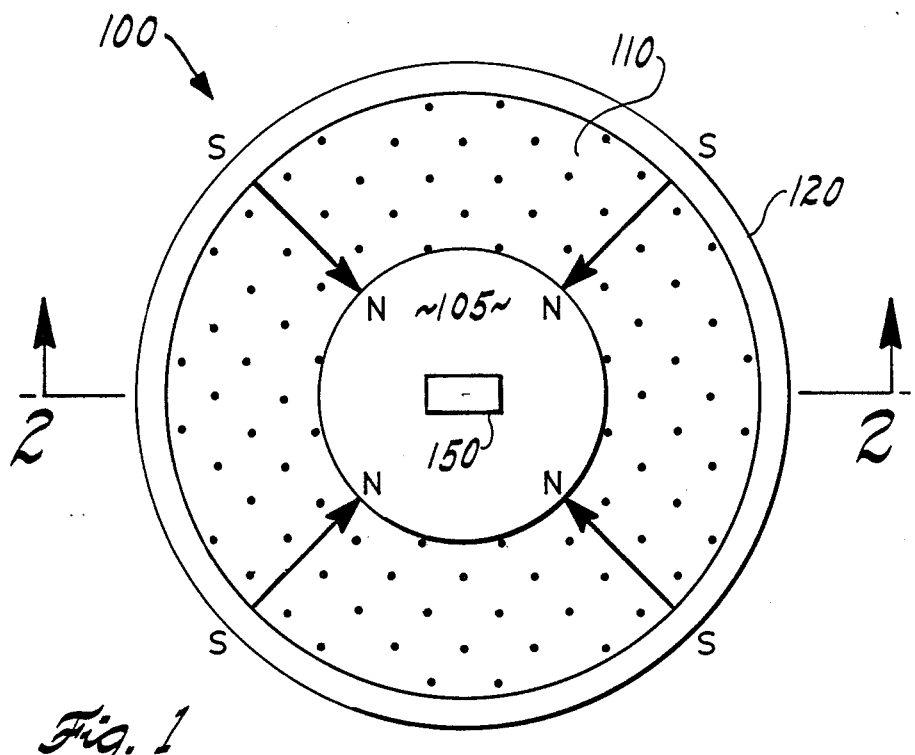
FIG. 1 illustrates the structure of the magneto resistive proximity sensor in accordance with a first embodiment of the present invention.
Figure 2:
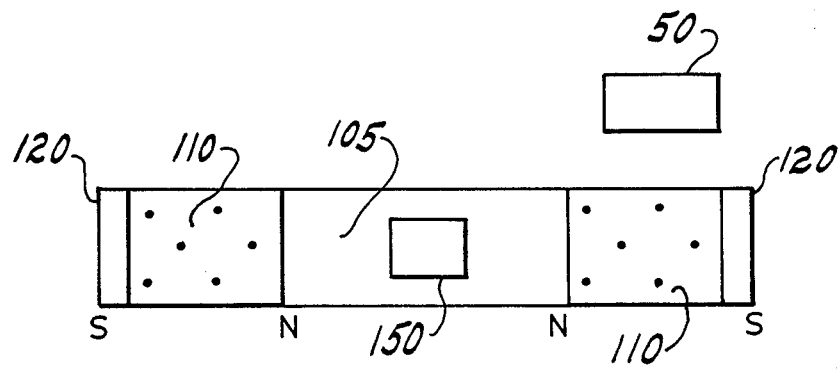
FIG. 2 illustrates a cross sectional view of the structure illustrated in FIG. 1.
Figure 3:
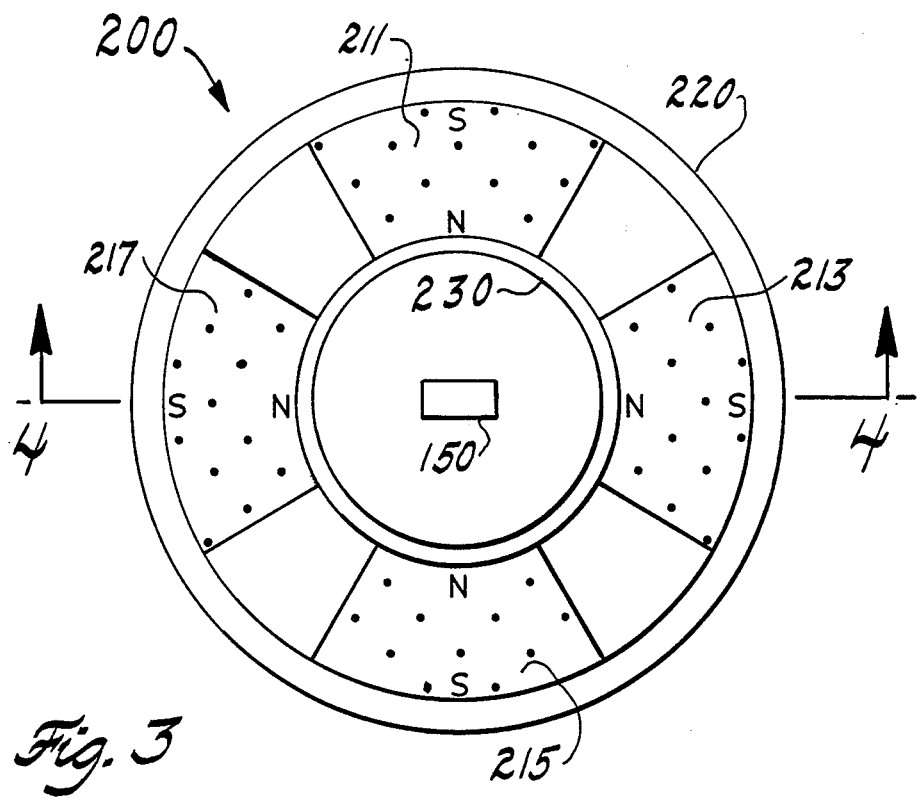
FIG. 3 illustrates the structure of the magneto resistive proximity sensor in accordance with an alternative embodiment of the present invention.
Figure 4:
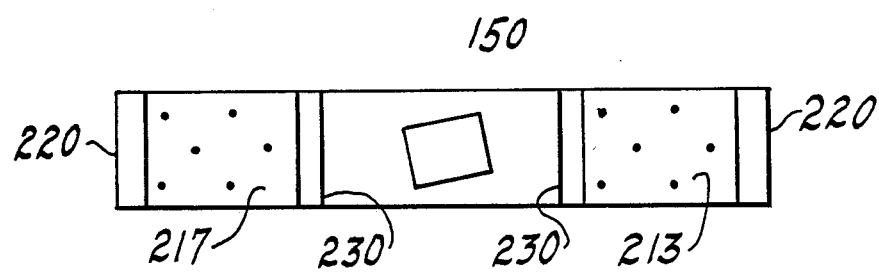
FIG. 4 illustrates a cross sectional view of the structure illustrated in FIG. 3.

FIGS. 1 and 3 illustrate plan views of two alternative embodiments of the structure of the magneto resistive proximity sensor of the present invention. FIGS. 2 and 4 illustrate respective cross sectional views of the structures of FIGS. 1 and 3. The essential feature of these two alternative embodiments are the toroidal magnets.

FIG. 1 illustrates a first embodiment of the proximity sensor of the present invention. Proximity sensor 100 includes permanent magnet 110, band 120 and magneto resistive structure 150. As illustrated in FIG. 1, permanent magnet 110 is disposed to have one pole at the inner circumference of the toroidal proximity sensor 100. At the same time the permanent magnet 110 has the opposite pole at the outer circumference of toroidal proximity sensor 100.

In the case illustrated in FIG. 1, the North pole is at the inner circumference and the South pole is located at the outer circumference. This is merely a design choice and the apparatus of the present invention would operate equally well with the opposite polarity of magnetization. Permanent magnet 110 could be assembled of a single piece of permanently magnetized material or could be assembled from a number of wedge-like pieces.

FIG. 1 further illustrates a band 120 disposed around the outer circumference of the proximity sensor 100. This band is formed of a material of high magnetic permeability. In the preferred embodiment band 120 is formed of steel. This band has the function of insuring that the outer circumference has a substantially uniform density of magnetic flux.

A magneto resistive structure 150 is disposed in the center of the central aperture 105 of the toroidal proximity sensor 100. As can be readily appreciated from the design illustrated in FIG. 1, the center of proximity sensor 100 is the location of a null in the magnetic flux created by the permanent magnet 110. This is due to the uniform placement of the North magnetic pole surrounding this location. Therefore, in the absence of any magnetic disturbance, magneto resistive structure 150 measures a minimum of magnetic flux.

Referring now to FIG. 2, a cross section of the proximity sensor 100 is illustrated. Note that magneto resistive structure 150 is disposed in the center of the central aperture 105 of proximity sensor 100. Any nearby object having a nonzero magnetic permeability causes changes in the magnetic flux in the region of the proximity sensor 100. In particular a magnetic target, such as target 50 illustrated in FIG. 2, causes a shift in the position of the magnetic null normally at the center of the central aperture 105 of the toroidal proximity sensor 100. Any such shift in the position of the magnetic null causes a large change in the magnetic flux through magneto resistive structure 150. This change in the magnetic flux can be detected as a change in resistance within magneto resistive structure 150.

FIG. 3 illustrates an alternative construction for the proximity sensor. Proximity sensor 200 illustrated in FIG. 3 includes permanent magnet wedges 211, 213, 215 and 217, first band 220, second band 230 and magneto resistive structure 150. This structure produces approximately the same pattern of magnetic flux for all regions of interest as that produced by the structure illustrated in FIG. 1.

The magnetic flux is created by permanent magnet wedges 211, 213, 215 and 217. Each of these permanent magnet wedges is formed of a permanently magnetized material with a first magnetic pole toward the inner circumference and a second, opposite magnetic pole toward the outer circumference. As illustrated in FIG. 3, the North magnetic pole is toward the inner circumference and the South magnetic pole is toward the outer circumference. As discussed above in relation to FIG. 1, this is a mere design choice and could be reversed. Note that the structure illustrated in Figure 3 includes four such spoke magnets disposed at intervals of 90 degrees.

As can be seen from FIG. 4, the magneto resistive structure 150 is tilted somewhat with respect to the axis of the toroidal proximity sensor 200. It has been found that a slight tilt, on the order of 7 degrees, enhances the sensitivity of magneto resistive structure 150.

Figure 5A:
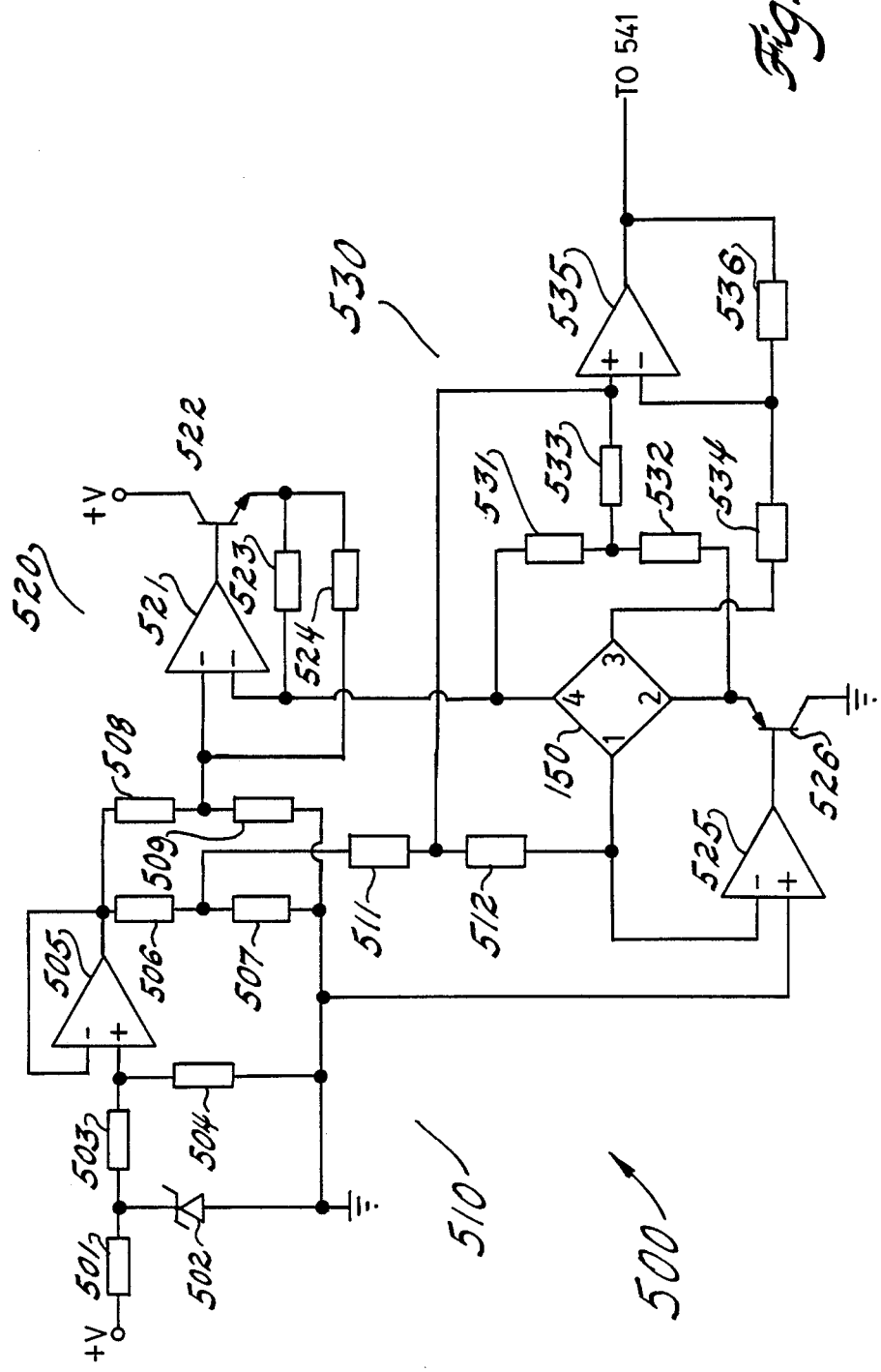
FIGS. 5a and 5b illustrate the electrical circuit employed in the preferred embodiment of the present invention.
Figure 5B:
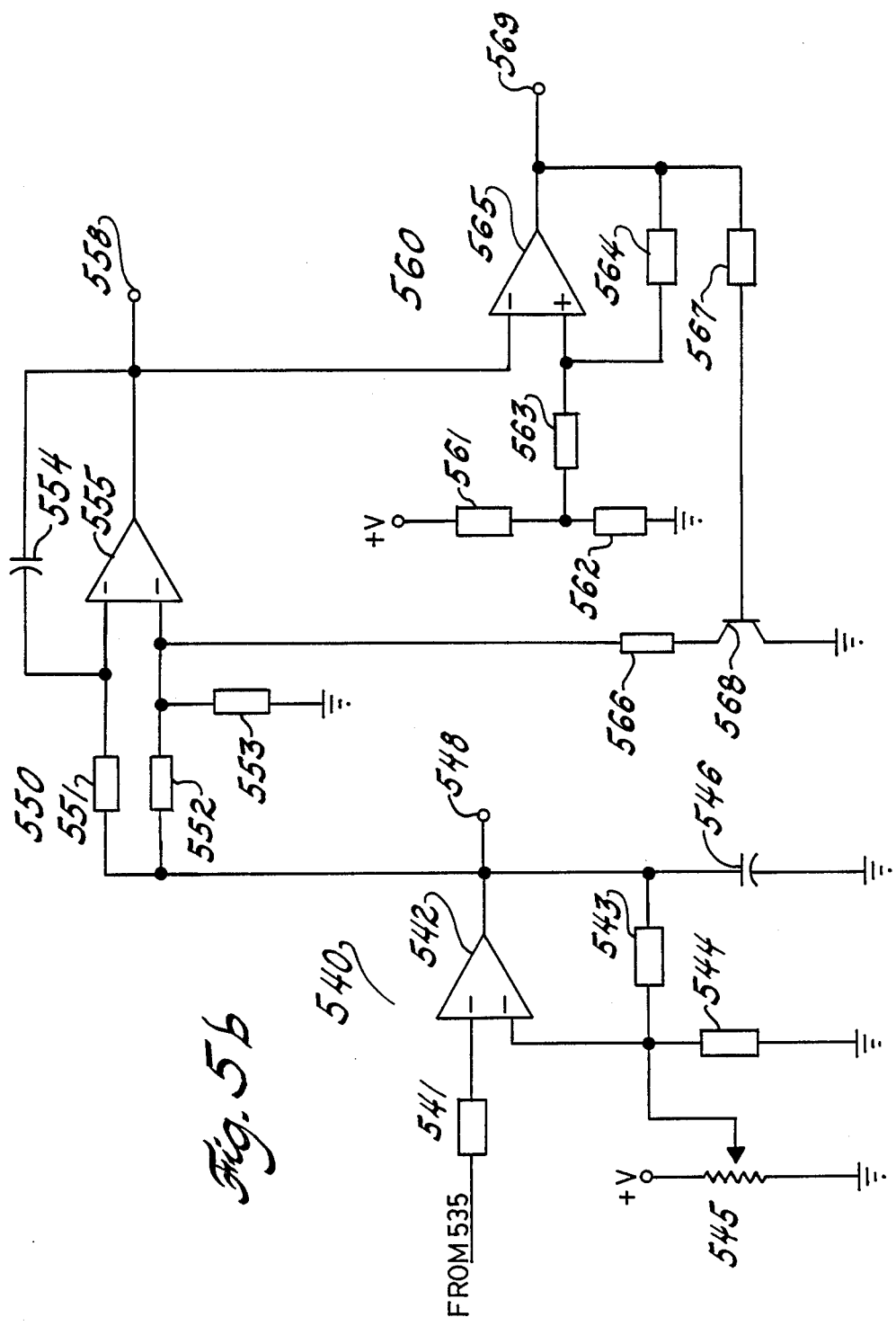

FIGS. 5a and 5b illustrate electronic circuit 500 for sensing the output of magneto resistive structure 150. Electronic circuit 500 consists of six major sections: stable voltage source 510; current driver 520; output circuit 530; comparator 540; triangular wave output driver 550; and square wave output driver 560.

Stable voltage source 510 serves to provide stable voltages for the current driver 520. Zener diode 502 is connected to the positive voltage supply via resistor 501. This provides a stable voltage to the noninverting input of operational amplifier 505 via the voltage divider consisting of resistors 503 and 504. The feedback to the inverting input of operational amplifier 505 provides unity gain from the amplifier and enables a low impedance output. This output of operational amplified drives two voltages dividers: a first consisting of resistors 506 and 507; and a second consisting of resistors 508 and 509. In addition, a further voltage divider consisting of resistors 511 and 512 is connected to the junction between resistors 506 and 507.

Current driver 520 supplies a stable current to magneto resistive structure 150 permitting accurate detection of the resistance changes in magneto resistive structure 150. Operational amplifier 521 drives transistor 522 to supply a predetermined current to terminal 4 of magneto resistive structure 150. Resistors 523 and 524 provide stabilization feedback. Operational amplifier 525 drives transistor 526 which provides a predetermined current out of terminal 2 of magneto resistive structure 150. Operational amplifier 525 serves to provide a predetermined voltage drop across the branch of magneto resistive structure 150 between terminals 1 and 2. This serves to stabilize the output voltage at terminal 3.

The output of the magneto resistive structure 150 is generated by output circuit 530. The noninverting input of operational amplifier 535 is connected to two voltage dividers. The first of these is formed of resistors 511 and 512, driven by stable voltage source 510. The second of these is resistors 531 and 532. Resistors 531 and 532 are connected in parallel with the magneto resistive structure 150 and has the same voltage thereacross. This voltage divider is connected to the noninverting input of operational amplifier 535 via resistor 533. The output of the magneto resistive structure 150 appearing at terminal 3 is connected to the inverting input of operational amplifier via resistor 534. Resistor 536 provides feedback from the output of operational amplifier 535 to the inverting input for control of gain.

Comparator 540 provides the proximity output of electronic circuit 500. Operational amplifier 542 compares the output of the magneto resistive structure 150 provided by operational amplifier 535 via resistor 541 and a predetermined voltage set by potentiometer 545. Potentiometer 545 is connected as a voltage divider to provide a predetermined voltage to the inverting input of operational amplifier 542. Resistors 543 and 544 provide gain stabilization feedback to operational amplifier 542. Capacitor 546 provides smoothing at the output of operational amplifier 542.

The first output of electronic circuit 500 appears at terminal 548. This output indicates when the output from magneto resistive structure 150 exceeds a predetermined threshold set by potentiometer 545. Thus potentiometer 545 sets the sensitivity of the electronic circuit 500. This can be set to require a large change in magnetic flux at magneto resistive structure 150 to trigger, thus requiring the magnetic target be relatively close. Alternately, potentiometer 545 can be set to require only a small change in magnetic flux at magneto resistive structure 150, thus permitting the magnetic target to be further away.

Triangular wave output driver 550 and square wave output driver 560 are advantageously employed when the proximity sensor is employed to detect a repetitive process, such as a shaft rotation with the magnetic target periodically rotated into proximity to the proximity sensor 100. Triangular wave output driver 550 provides a up/down sloping output in response to the on/off output at terminal 548. Terminal 548 is connected to the inverting input of operational amplifier 555 via resistor 551 and to the noninverting input via resistor 552. Resistor 553 provides input loading to the noninverting input of operational amplifier 555. Feedback via capacitor 543 causes the generation of the triangular wave at the output terminal 558.

Square wave output driver circuit 560 provides a square wave output at terminal 569. The inverting input of operational amplifier 565 is connected to the triangular wave output at terminal 558. This input is compared to a predetermined voltage set by the voltage divider consisting of resistors 561 and 562. The voltage set by these resistors is coupled to the noninverting input of operational amplifier 565 via resistor 563. Resistor 564 provides feedback and causes operational amplifier 565 to operate as a saturating amplifier. The square wave output appearing at terminal 569 depends upon whether the triangular wave is greater than the predetermined voltage set by resistors 561 and 562. Additional feedback between triangular wave output driver and square wave output driver is provided by resistors 566 and 568 and transistor 568.

Table 1 indicates the component values for the various components of electronic circuit 500 in accordance with the preferred embodiment.

TABLE 1
Resistors

TABLE 1-continued

| | |
|---|---|
| 501 1 kilo ohm | 534 5.2 kilo ohm |
| 503 120 kilo ohm | 536 270 kilo ohm |
| 504 82 kilo ohm | 541 82 kilo ohm |
| 506 50 kilo ohm | 543 100 kilo ohm |
| 507 50 kilo ohm | 544 19 kilo ohm |
| 508 50 kilo ohm | 551 40 kilo ohm |
| 509 50 kilo ohm | 552 20 kilo ohm |
| 511 1 mega ohm | 553 20 kilo ohm |
| 512 82 kilo ohm | 562 51 kilo ohm |
| 523 103 ohm | 562 51 kilo ohm |
| 524 3.9 kilo ohm | 563 51 kilo ohm |
| 531 3 kilo ohm | 564 500 kilo ohm |
| 532 3 kilo ohm | 566 20 kilo ohm |
| 533 330 kilo ohm | 567 5 kilo ohm |
| Potentiometer | |
| 545 50 kilo ohm | |
| Capacitors | |
| 546 .01 micro Farad | 554 .001 micro Farad |
| Transistors | |
| 522 LM2222 | 568 LM2222 |
| 526 LM2927 | |
| Zener Diode | |
| 502 6.8 volts | |

Although the present invention has been described in conjunction with a preferred embodiment, those skilled in the art will recognize that the present invention can be practiced in other alternative embodiments. Therefore the claims should be studied in order to ascertain the extent and scope of the present invention.

We claim:

1. A proximity sensor comprising: a toroidal magnet consisting of a disk of permanent magnetic material having an outer circumference and a circular central aperture therethrough forming an inner circumference, and a band of material having a high magnetic permeability disposed at said outer circumference, said disk of permanent magnetic material constructed with a first magnetic pole at said inner circumference and a second magnetic pole at said outer circumference thereby creating a magnetic null at a center position of said central aperture;
 a magneto resistive structure disposed at said central portion of said central aperture of said toroidal magnet, thereby disposed at said magnetic null, having an electrical resistance proportional to the magnetic flux therethrough from said toroidal magnet; and
 an electrical detection circuit connected to said magneto resistive structure for detecting changes in said electrical resistance for indication of the proximity of a magnetically permeable target to said proximity sensor.

2. The proximity sensor claimed in claim 1, wherein: said band of material having a high magnetic permeability includes steel.

3. The proximity sensor claimed in claim 1, wherein: said electrical detection circuit includes a resistance measurement circuit connected to said magneto resistive structure for generating an electrical output signal proportional to the resistance of said magneto resistive structure and a comparator connected to said resistance measurement circuit for comparing said electrical output signal to a predetermined reference signal for generating said indication of the proximity of a magnetic target to said proximity sensor when said electrical output signal exceeds said predetermined reference signal.

4. The proximity sensor claimed in claim 3, wherein: said predetermined reference signal of said comparator is operator adjustable thereby permitting adjustment of the sensitivity of said proximity detector.

5. The proximity sensor claimed in claim 3, wherein: said electrical detection circuit further includes a triangle wave output circuit connected to said comparator for generating a triangle wave output signal having an up sloping output of predetermined slope when said comparator generates said indication of the proximity of a magnetic target to said proximity sensor and having a down sloping output of predetermined slope when said comparator does not generate said indication of the proximity of a magnetic target to said proximity sensor.

6. The proximity sensor claimed in claim 5, wherein: said electrical detection circuit further includes a square wave output circuit connected to said triangle wave output circuit for generating a square wave output signal having a first level when said triangle wave output signal is greater than a predetermined level and having a second level when said triangle wave output signal is less than said predetermined level.

7. A proximity sensor comprising:
 a toroidal magnet consisting of a first circular band of material having a high magnetic permeability disposed at an inner circumference forming a circular central aperture, a second circular band of material having a high magnetic permeability disposed at an outer circumference concentric with said inner circumference, and a plurality of spokes of permanent magnetic material disposed between said inner circumference and said outer circumference, each spoke of permanent magnetic material having a first magnetic pole disposed at said at said inner circumference and a second magnetic pole disposed at said outer circumference thereby creating a magnetic null at a center position of said central aperture;
 a magneto resistive structure disposed at said central portion of said central aperture of said toroidal magnet, thereby disposed at said magnetic null, having an electrical resistance proportional to the magnetic flux therethrough from said toroidal magnet; and
 an electrical detection circuit connected to said magneto resistive structure for detecting changes in said electrical resistance for indication of the proximity of a magnetically permeable target to said proximity sensor.

8. The proximity sensor claimed in claim 7, wherein: said first and second bands of material having a high magnetic permeability includes steel.

9. The proximity sensor claimed in claim 7, wherein: said plurality of spokes of permanent magnetic material consists of four spokes of permanent magnetic material disposed at ninety degree intervals about said inner circumference.

10. The proximity sensor claimed in claim 7, wherein: said electrical detection circuit includes a resistance measurement circuit connected to said magneto resistive structure for generating an electrical output signal proportional to the resistance of said magneto resistive structure and a comparator connected to said resistance measurement circuit for comparing said electrical output signal to a predetermined reference signal for generating said indication of the proximity of a magnetic target to said proximity sensor when said electrical output signal exceeds said predetermined reference signal.

11. The proximity sensor claimed in claim 10, wherein:

said predetermined reference signal of said comparator is operator adjustable thereby permitting adjustment of the sensitivity of said proximity detector.

12. The proximity sensor claimed in claim 11, wherein:

said electrical detection circuit further includes a triangle wave output circuit connected to said comparator for generating a triangle wave output signal having an up sloping output of predetermined slope when said comparator generates said indication of the proximity of a magnetic target to said proximity sensor and having a down sloping output of predetermined slope when said comparator does not generate said indication of the proximity of a magnetic target to said proximity sensor.

13. The proximity sensor claimed in claim 12, wherein:

said electrical detection circuit further includes a square wave output circuit connected to said triangle wave output circuit for generating a square wave output signal having a first level when said triangle wave output signal is greater than a predetermined level and having a second level when said triangle wave output signal is less than said predetermined level.

14. A proximity sensor comprising:

a toroidal magnet having a central aperture, an inner circumference and an outer circumference with a first magnetic pole at said inner circumference and a second magnetic pole at said outer circumference thereby creating a magnetic null at a center position of said central aperture; and a magneto resistive structure disposed at said center position of said central aperture of said toroidal magnetic having an electrical resistance proportional to the magnetic flux therethrough from said toroidal magnet resulting from a shift in the position of said magnetic null caused by the proximity of a magnetically permeable target to said toroidal magnet.

* * * * *